(12) United States Patent
Kitada

(10) Patent No.: US 9,287,491 B2
(45) Date of Patent: Mar. 15, 2016

(54) PIEZOELECTRIC ELEMENT, LIQUID EJECTING HEAD, AND SENSOR

(71) Applicant: Seiko Epson Corporation, Tokyo (JP)

(72) Inventor: Kazuya Kitada, Suwa (JP)

(73) Assignee: Seiko Epson Corporation (JP)

(*) Notice: Subject to any disclaimer, the term of this patent is extended or adjusted under 35 U.S.C. 154(b) by 0 days.

(21) Appl. No.: 14/599,748

(22) Filed: Jan. 19, 2015

(65) Prior Publication Data

US 2015/0236243 A1     Aug. 20, 2015

(30) Foreign Application Priority Data

Jan. 20, 2014   (JP) ................... 2014-008030

(51) Int. Cl.
| | |
|---|---|
| B41J 2/045 | (2006.01) |
| H01L 41/18 | (2006.01) |
| B41J 2/14 | (2006.01) |
| H01L 41/113 | (2006.01) |
| H01L 41/187 | (2006.01) |

(52) U.S. Cl.
CPC ............ *H01L 41/18* (2013.01); *B41J 2/14201* (2013.01); *B41J 2/14233* (2013.01); *H01L 41/1132* (2013.01); *H01L 41/1878* (2013.01); *B41J 2202/03* (2013.01)

(58) Field of Classification Search
CPC .............. B41J 2/14201; B41J 2/14209; B41J 2/14233; B41J 2/14274
See application file for complete search history.

(56) References Cited

U.S. PATENT DOCUMENTS

| | | | |
|---|---|---|---|
| 2005/0082946 A1* | 4/2005 | Takeuchi et al. | 310/328 |
| 2011/0043574 A1 | 2/2011 | Yonemura | |

FOREIGN PATENT DOCUMENTS

| | | |
|---|---|---|
| JP | 2001-223404 A | 8/2001 |
| JP | 2009-252789 A | 10/2009 |
| JP | 2010-054885 | 3/2010 |
| JP | 2011-066382 | 3/2011 |

OTHER PUBLICATIONS

Naoyuki Itoh et al., "Effects of $SrTiO_3$ Content and Mn Doping on Dielectric and Magnetic Properties of $BIFeO_3$—$SrTiO_3$ Ceramics", Journal of the Ceramic Society of Japan 117 [9], 2009, pp. 939-943.

* cited by examiner

*Primary Examiner* — Juanita D Jackson
(74) *Attorney, Agent, or Firm* — Harness, Dickey & Pierce, P.L.C.

(57) ABSTRACT

A piezoelectric element 300 includes a first electrode 60, a piezoelectric layer 70 arranged on the first electrode 60, and a second electrode 80 arranged on the piezoelectric layer 70, in which the piezoelectric layer 70 includes a composite oxide which has a perovskite structure and the composite oxide has a composition represented as a mixed crystal of bismuth ferrate and strontium titanate.

9 Claims, 11 Drawing Sheets

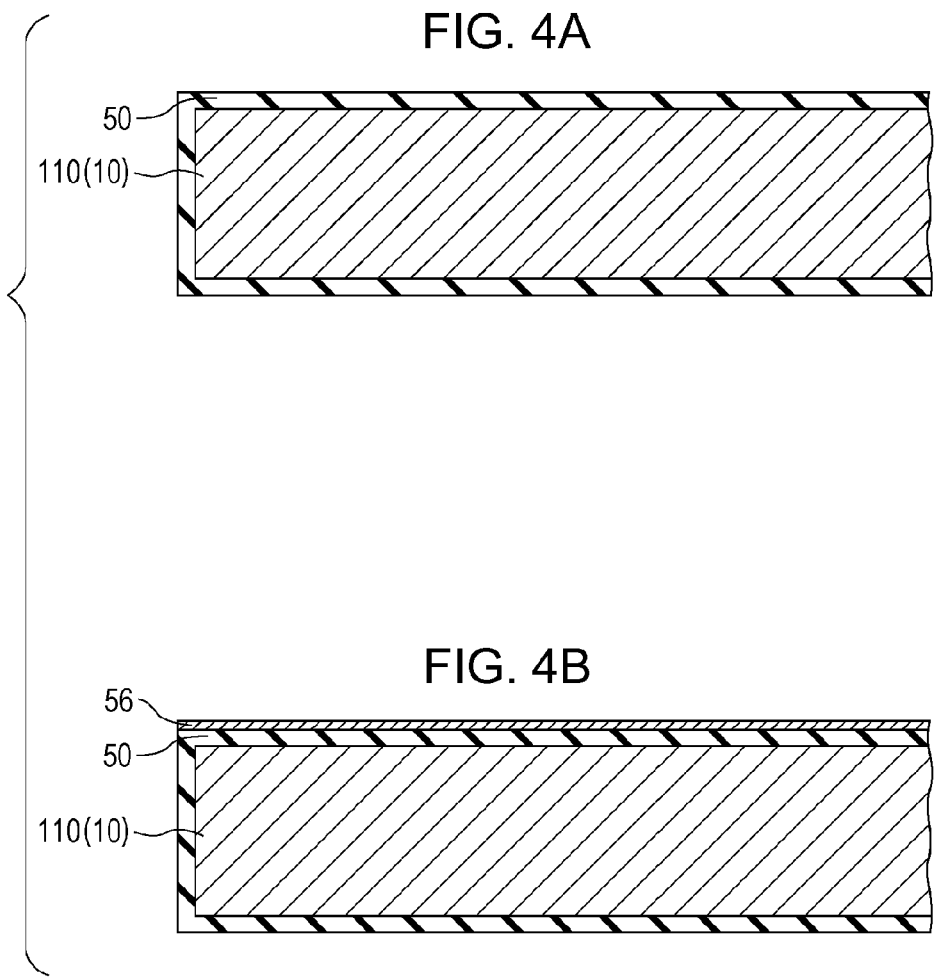

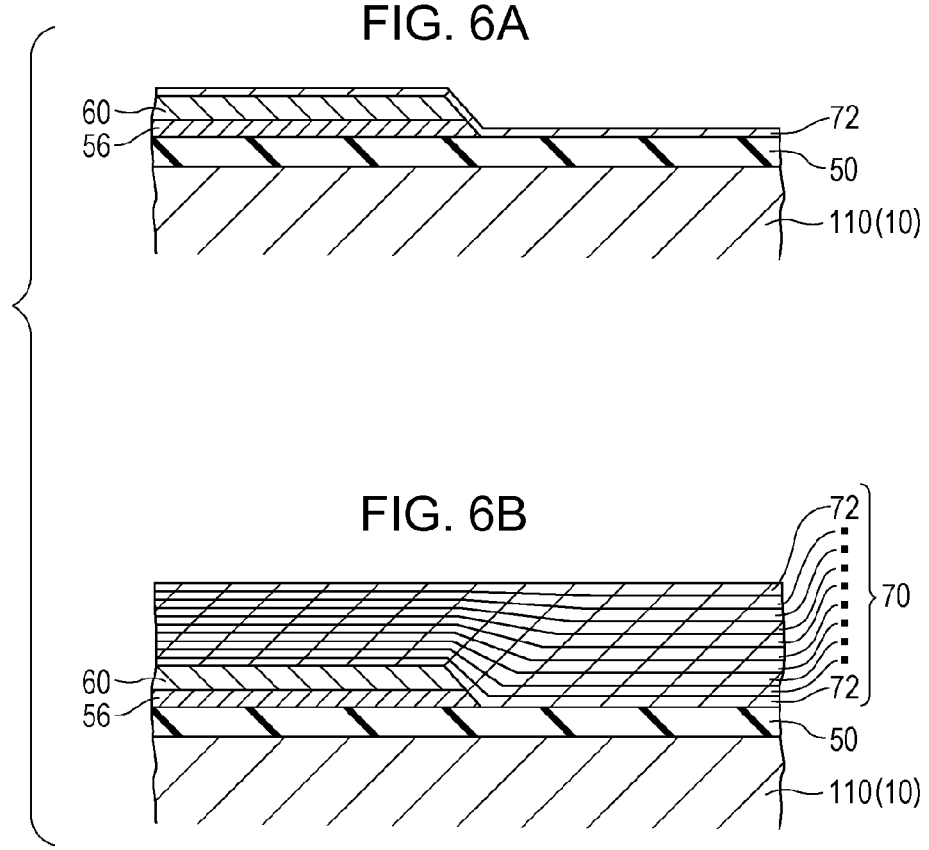

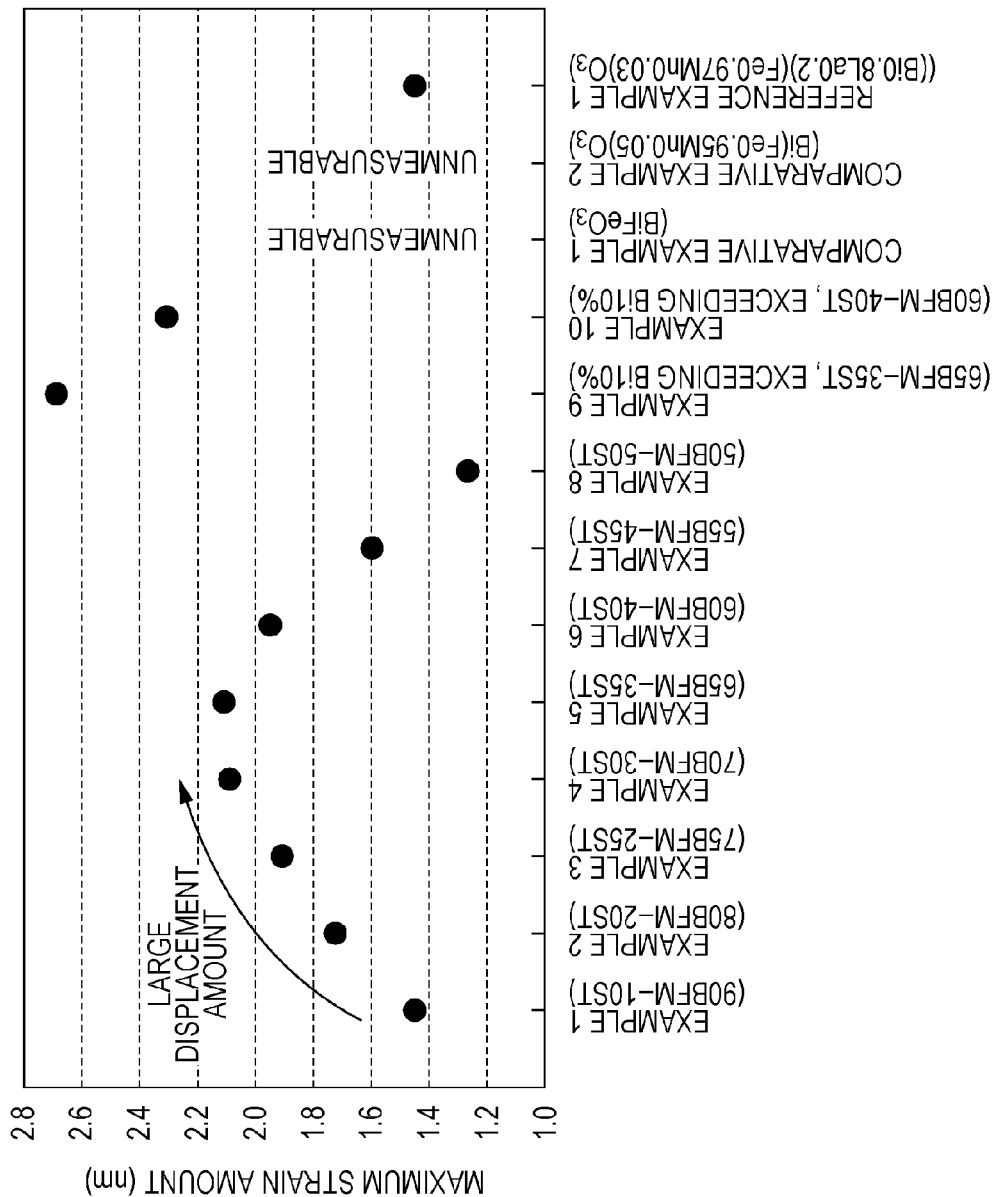

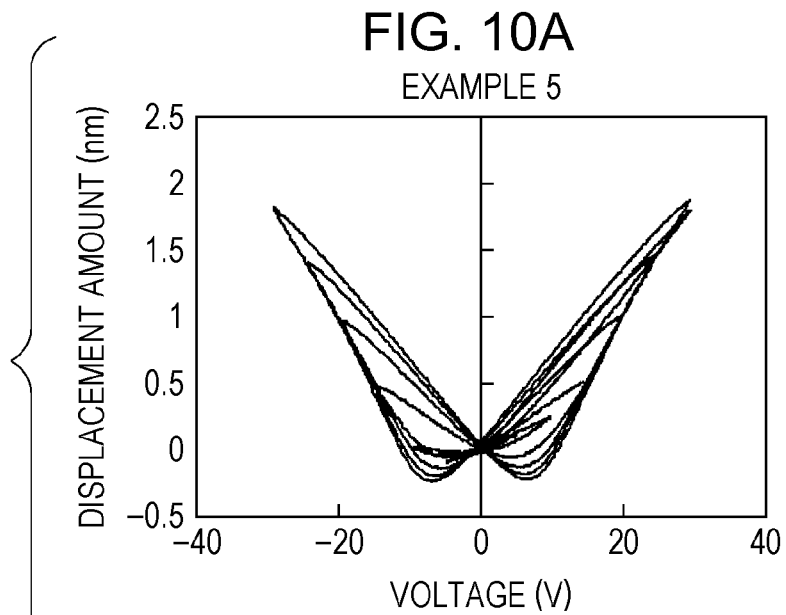
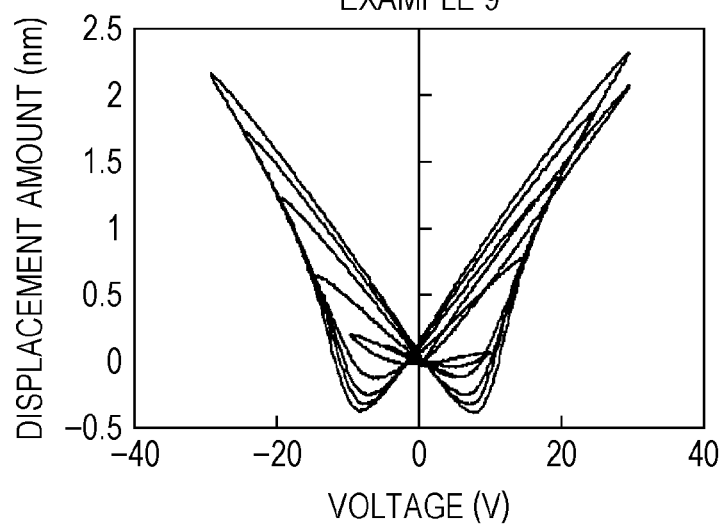

PIEZOELECTRIC ELEMENT, LIQUID EJECTING HEAD, AND SENSOR

BACKGROUND

1. Technical Field

The present invention relates to a piezoelectric element, a liquid ejecting head, and a sensor.

2. Related Art

As a piezoelectric element, there is a piezoelectric element configured by sandwiching a piezoelectric layer including a piezoelectric material showing an electromechanical conversion function, for example, a crystallized piezoelectric material with two electrodes. Such a piezoelectric element is installed in a liquid ejecting head, for example, as an actuator for a flexural vibration mode. As a typical example of a liquid ejecting head, for example, there is an ink jet type recording head in which a part of a pressure generating chamber communicating with a nozzle opening for discharging ink droplets is configured with a vibration plate, an ink in the pressure generating chamber is pressurized by deforming the vibration plate by using the piezoelectric element, and the ink is discharged from the nozzle opening as ink droplets.

Presently, lead zirconate titanate (PZT) in which lead is used as a main component, is generally used for a piezoelectric material used as a piezoelectric layer configuring the piezoelectric element (for example, refer to JP-A-2001-223404), however, there is a need to develop a lead-free based piezoelectric material which does not include lead from the viewpoint of environmental problems. As a lead-free based piezoelectric material, for example, there is an oxide in which bismuth ferrate or barium titanate is solutionized (for example, refer to JP-A-2009-252789). Furthermore, in order to enhance the piezoelectric characteristics such as a displacement amount, it is possible to use a piezoelectric material in which an alkali metal is introduced into bismuth ferrate, for example, an oxide in which bismuth ferrate, bismuth potassium titanate, and bismuth manganite are solutionized (for example, refer to JP-A-2011-066382), sodium potassium niobate, bismuth sodium titanate, and the like.

However, currently, the large displacement amount enough to surpass that of lead zirconate titanate has not been obtained by such a piezoelectric material yet. In addition to that, in the piezoelectric material including an alkali metal such as sodium potassium niobate or bismuth sodium titanate, there is also a possibility in which changes over time such as moisture absorption of an unreacted alkali metal occur.

Meanwhile, such a problem is not limited to the piezoelectric element which is installed in an ink jet type recording head and similarly exists in piezoelectric element which is installed in other liquid ejecting heads which discharge liquid droplets other than an ink and a piezoelectric element which is installed in a sensor.

An advantage of some aspects of the invention is to provide a piezoelectric element which is configured with a lead-free based piezoelectric material which does not include an alkali metal and in which a displacement amount is enhanced, a liquid ejecting head provided with the piezoelectric element, and a sensor.

SUMMARY

According to an aspect of the invention, there is provided a piezoelectric element including a first electrode, a piezoelectric layer arranged on the first electrode, and a second electrode arranged on the piezoelectric layer, in which the piezoelectric layer includes a composite oxide which has a perovskite structure and the composite oxide has a composition represented as a mixed crystal of bismuth ferrate and strontium titanate. In the aspect, by the piezoelectric layer including the composite oxide having a composition represented as a mixed crystal of bismuth ferrate which is a rhombohedral crystal and strontium titanate which is a cubical crystal, the piezoelectric layer has an excellent ferroelectricity and it is possible to provide a piezoelectric element in which the displacement amount is enhanced. In addition, since the piezoelectric layer does not include an alkali metal such as sodium which is very sensitive to water, it is possible to provide a piezoelectric element in which changes over time due to moisture absorption or the like are relatively small. Furthermore, since the piezoelectric layer is configured with the lead-free based piezoelectric material, it is possible to provide the piezoelectric element in which a load to an environment is reduced.

Here, it is preferable that bismuth and strontium of the composite oxide are included at an A site of the perovskite structure and iron and titanium of the composite oxide are included at a B site of the perovskite structure. Accordingly, the piezoelectric layer including the composite oxide having a perovskite structure is easily obtained and it is possible to provide a piezoelectric element in which the displacement amount is enhanced.

Here, it is preferable that a content of strontium titanate of the composite oxide is from 10 mol % to 50 mol % with respect to the composite oxide. Accordingly, the piezoelectric layer has more excellent ferroelectricity and the displacement amount also becomes excellent. In particular, by setting the content of strontium titanate to be from 20 mol % to 45 mol % with respect to the composite oxide, it is possible to surely enhance the displacement amount.

Here, it is preferable that the composite oxide includes at least one element selected from manganese, chromium, cobalt, nickel, copper, and zinc. Accordingly, it is possible to reduce a leak current.

Here, it is preferable that, in the composite oxide, bismuth described above is included while exceeding a stoichiometry composition by more than 0 mol % and 10 mol % or less. Accordingly, it is possible to remarkably enhance the displacement amount.

Here, it is preferable that the composite oxide is represented by the following general formula (1) or (1'). Accordingly, the composite oxide represented by the following general formula (1) or (1') has more excellent ferroelectricity and the displacement amount also becomes excellent. In particular, by setting the content of strontium titanate with respect to the composite oxide or the content of strontium with respect to the metal at the A site of a perovskite structure to be from 20 mol % to 45 mol %, it is possible to surely enhance the displacement amount.

$$(1-x)[BiFeO_3]-x[SrTiO_3] \tag{1}$$

$(0.1 \leq x \leq 0.5)$

$$(Bi_{1-x}Sr_x)(Fe_{1-x}Ti_x)O_3 \tag{1'}$$

$(0.1 \leq x \leq 0.5)$

Here, according to another aspect of the invention, there is provided a liquid ejecting head provided with the piezoelectric element according to any one of the aspects described above. In the aspect, since the liquid ejecting head is provided with the piezoelectric element having the piezoelectric layer which has excellent ferroelectricity and in which the displacement amount is enhanced and changes over time due to moisture absorption or the like are relatively small, it is possible to provide a liquid ejecting head excellent in discharge characteristics. In addition, since the piezoelectric layer is configured with the lead-free based piezoelectric material, it is possible to provide a liquid ejecting head in which a load to an environment is reduced.

Here, according to still another aspect of the invention, there is provided a sensor provided with the piezoelectric element according to any one of the aspects described above. In the aspect, since the sensor is provided with the piezoelectric element having the piezoelectric layer which has excellent ferroelectricity and in which the displacement amount is enhanced and changes over time due to moisture absorption or the like, are relatively small, it is possible to provide a sensor with high detection sensitivity. In addition, since the piezoelectric layer is configured with the lead-free based piezoelectric material, it is possible to provide a sensor in which a load to an environment is reduced.

BRIEF DESCRIPTION OF THE DRAWINGS

FIGS. 4A to 4B are cross-section views illustrating a manufacturing process of the recording head according to Embodiment 1.

FIGS. 6A to 6B are cross-section views illustrating a manufacturing process of the recording head according to Embodiment 1.

FIG. 9 is a view illustrating results when maximum strain amounts of Examples 1 to 10, Comparative Examples 1 and 2, and Reference Example 1 are measured.

FIGS. 10A to 10B are views illustrating a relationship between a displacement amount and a voltage of Examples 5 and 9.

DESCRIPTION OF EXEMPLARY EMBODIMENTS

Embodiment 1

Figure 1:
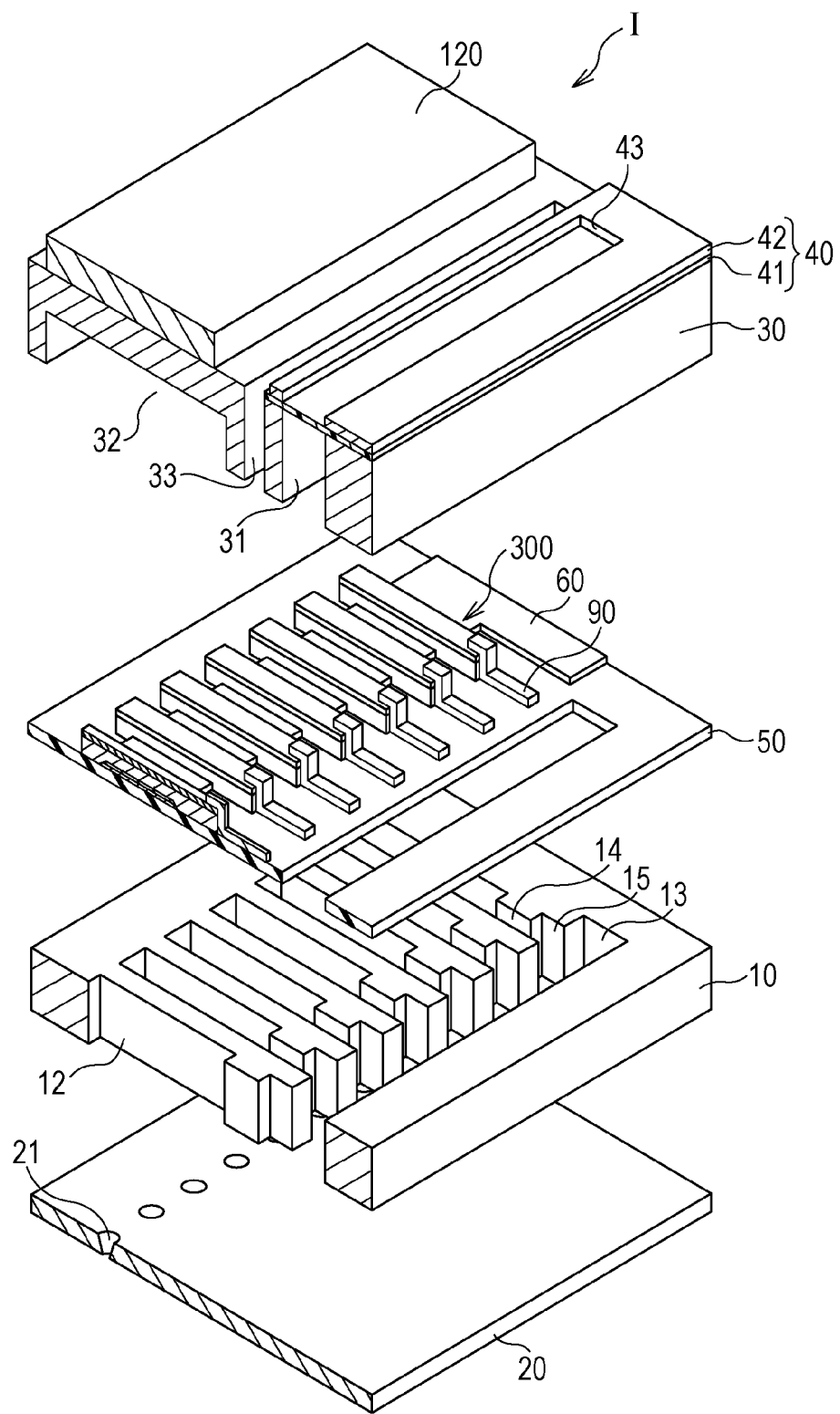
FIG. 1 is an exploded perspective view illustrating a schematic configuration of a recording head according to Embodiment 1.
Figure 2:
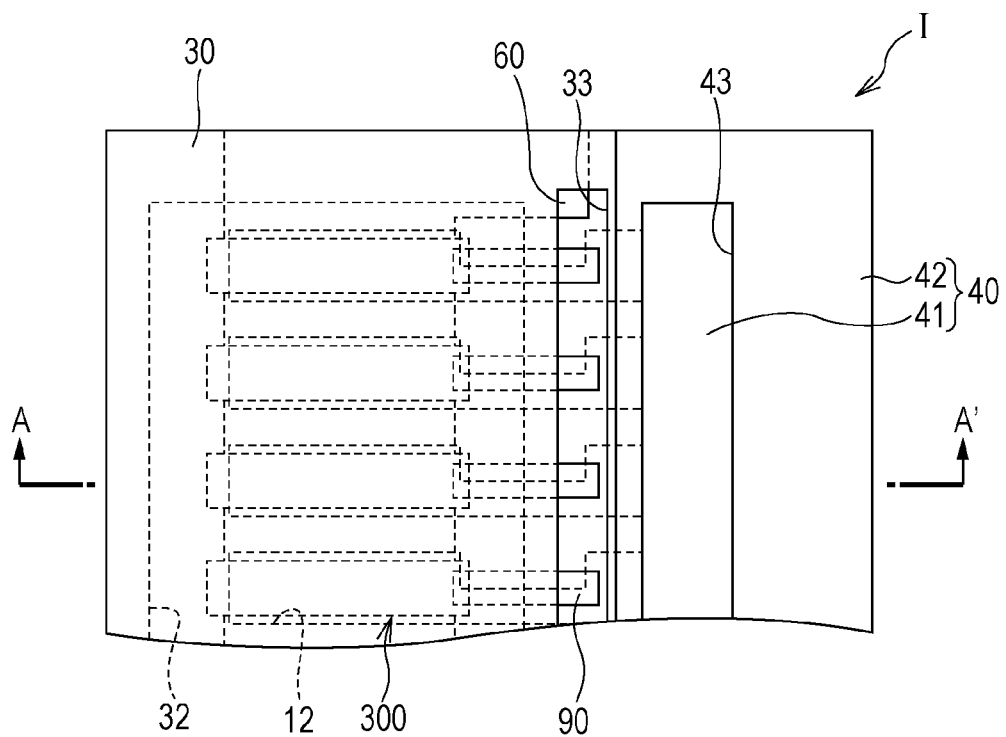
FIG. 2 is a plan view of the recording head according to Embodiment 1.
Figure 3:
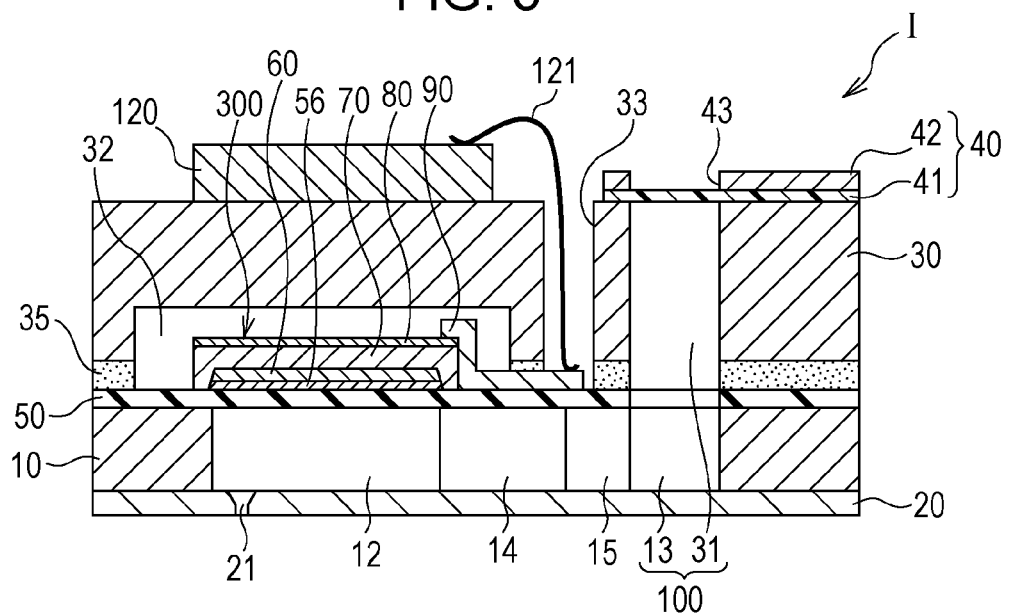
FIG. 3 is a cross-section view of the recording head according to Embodiment 1.

FIG. 1 is an exploded perspective view illustrating a schematic configuration of an ink jet type recording head which is an example of a liquid ejecting head provided with a piezoelectric element according to Embodiment 1 of the invention, FIG. 2 is a plan view of FIG. 1, and FIG. 3 is a cross-section view taken along a line A-A' in FIG. 2. As shown in FIG. 1 to FIG. 3, a channel forming substrate 10 of the embodiment is formed of a silicon single crystal substrate and an elastic film 50 including silicon dioxide is formed on one face thereof.

A plurality of pressure generating chambers 12 are arranged in parallel in a width direction of the channel forming substrate 10 on the channel forming substrate 10. In addition, a communication portion 13 is formed in a region of an outer side in a longitudinal direction of the pressure generating chamber 12 of the channel forming substrate 10 and the communication portion 13 and each pressure generating chamber 12 communicate with each other through an ink supply passage 14 and a communication passage 15 which are arranged for each pressure generating chamber 12. The communication portion 13 communicates with a manifold portion 31 of a protection substrate described later and configures a part of a manifold which becomes a common ink chamber of each pressure generating chamber 12. The ink supply passage 14 is formed with a width narrower than that of the pressure generating chamber 12 and maintains a channel resistance of an ink flowing from the communication portion 13 into the pressure generating chamber 12 constant. Meanwhile, in the embodiment, while the ink supply passage 14 is formed by contracting the width of the channel from one side, the ink supply passage 14 may be formed by contracting the width of the channel from both sides. In addition, the ink supply passage 14 may be formed by not contracting the width of the channel but contracting the channel in a thickness direction. In the embodiment, a liquid channel formed of the pressure generating chamber 12, the communication portion 13, the ink supply passage 14, and the communication passage 15 is arranged on the channel forming substrate 10.

In addition, a nozzle plate 20 on which, a nozzle opening 21 communicating with the vicinity of an end part of the side opposite to the ink supply passage 14 of each pressure generating chamber 12 is bored, adheres to an opening face side of the channel forming substrate 10, with an adhesive, a heat welding film, or the like. Meanwhile, the nozzle plate 20 is formed of, for example, a glass ceramics, a silicon single crystal substrate, a stainless steel, or the like.

On the other hand, as described above, the elastic film 50 is formed on the side opposite to the opening face of such the channel forming substrate 10 and an adhesion layer 56 including, for example, titanium oxide having a thickness from approximately 30 nm to 50 nm or the like is formed on the elastic film 50. The adhesion layer 56 is arranged for enhancing adhesion properties between the elastic film 50 and a first electrode 60. Meanwhile, an insulation film including zirconium oxide or the like may be arranged on the elastic film 50, as necessary.

Furthermore, the first electrode 60, a piezoelectric layer 70 which is a thin film in which the thickness thereof is 3 μm or less and preferably from 0.3 μm to 1.5 μm, and a second electrode 80 are laminated and formed on the adhesion layer 56 to configure a piezoelectric element 300. Here, the term the piezoelectric element 300 means a part including the first electrode 60, the piezoelectric layer 70, and the second electrode 80. In general, the piezoelectric element 300 is configured by setting any one of the electrodes of the piezoelectric element 300 to a common electrode and patterning the other electrode and the piezoelectric layer 70 for each pressure generating chamber 12. In the embodiment, while the first electrode 60 is set to the common electrode of the piezoelectric element 300 and the second electrode 80 is set to an individual electrode of the piezoelectric element 300, there is no trouble even if these are reversed on the grounds of a driving circuit or a wiring. In addition, here, the piezoelectric element 300 and the vibration plate in which the displacement is generated by driving the piezoelectric element 300 are collectively referred to as an actuator. Meanwhile, in the example described above, the elastic film 50, the adhesion layer 56, the first electrode 60, and the insulation film which is arranged as necessary, may act as a vibration plate, however, naturally, the vibration plate is not limited thereto, and, for example, the elastic film 50 or the adhesion layer 56 may not be arranged. In addition, the piezoelectric element 300 itself may be set so as to substantially serve as a vibration plate. However, in a case where the first electrode 60 is directly arranged on the channel forming substrate 10, it is preferable to protect the first electrode 60 by an insulating protection film or the like so as not to electrically connect the first electrode 60 with ink.

The piezoelectric layer 70 according to the invention includes the composite oxide which includes bismuth (Bi), iron (Fe), strontium (Sr), and titanium (Ti) and has a perovskite structure and the composite oxide has a composition represented as a mixed crystal of bismuth ferrate ($BiFeO_3$) and strontium titanate ($SrTiO_3$), that is, is configured with a composition for achieving a mixed crystal. 12 oxygens are coordinated at the A site in a perovskite type structure, that is, an $ABO_3$ type structure and, in addition, 6 oxygens are coordinated at the B site to make an octahedron. In the embodiment, Bi and Sr are positioned at the A site and Fe and Ti are positioned at the B site.

Here, a crystal structure of bismuth ferrate is a rhombohedral crystal and a crystal structure of strontium titanate is a cubical crystal, which together configure the piezoelectric layer 70. By configuring the piezoelectric layer 70 with the composition for achieving the mixed crystal of bismuth ferrate and strontium titanate of which the crystal structures are different from each other, the piezoelectric layer has excellent ferroelectricity and the displacement amount is enhanced. Specifically, as to the piezoelectric element provided with the piezoelectric layer 70 according to the invention, a butterfly curve showing a relationship between a displacement amount and a voltage becomes a shape showing more excellent displacement characteristics (electric field induced strain characteristics), as shown in Example described later, compared with that of the piezoelectric layer formed of a solitary crystal, for example, the piezoelectric element provided with bismuth ferrate ($BiFeO_3$), bismuth ferrate manganite ($BiFeMnO_3$), or bismuth lanthanum ferrate manganite ($BiLaFeMnO_3$). In addition, it has been confirmed that a hysteresis curve showing a relationship between a polarization amount and a voltage becomes a shape showing excellent ferroelectricity in which squareness and a residual polarization value ($P_r$) are enhanced. The piezoelectric element provided with such the piezoelectric layer 70 can be suitably used for not only the piezoelectric element, but also for, for example, a nonvolatile memory or the like in which ferroelectricity is utilized.

Furthermore, since the piezoelectric layer 70 according to the invention does not include an alkali metal such as sodium or potassium which is very sensitive to water, it is possible to make changes over time due to moisture absorption or the like relatively small, for a lead-free material.

Here, the content of strontium titanate ($SrTiO_3$) included in the piezoelectric layer 70 including the composite oxide is preferably from 10 mol % to 50 mol % and more preferably from 20 mol % to 45 mol %, with respect to the composite oxide (the piezoelectric layer 70). By setting the content of $SrTiO_3$ to be from 10 mol % to 50 mol % with respect to the composite oxide, the piezoelectric layer 70 has more excellent ferroelectricity and the displacement amount also becomes excellent. In particular, in a case where the composite oxide is represented by the general formula (1) or (1') described later, by setting the content of $SrTiO_3$ with respect to the composite oxide or the content of strontium with respect to the metal at the A site of a perovskite structure to be from 20 mol % to 45 mol %, it is possible to surely enhance the displacement amount.

Furthermore, it is preferable that, in the composite oxide, Bi is included while exceeding a stoichiometry composition by more than 0 mol % and 10 mol % or less. Accordingly, it is possible to remarkably enhance the displacement amount.

It is preferable that the composition of the composite oxide configured with such a composition for achieving the mixed crystal of bismuth ferrate and strontium titanate is represented by the following general formula (1) or the following general formula (1'). Here, descriptions of the general formula (1) and the general formula (1') are composition notations based on stoichiometry and, as described above, as long as the composite oxide can have a perovskite structure, not only an unavoidable deviation of the composition due to a lattice mismatch, a partial damage of an element (Bi, Fe, Ba, Ti, Sr, or O), or the like, but also a partial substitution of an element or the like are acceptable. For example, when the stoichiometric ratio is set to 1, the composition within a range from 0.85 to 1.20 is acceptable. In addition, in a case of being represented by the general formulae as described below, even if the compositions differ, there are some cases where the composite oxides in which the ratios of an element at the A site to an element at the B site are same are considered to be the same composite oxides.

$$(1-x)[BiFeO_3]\text{-}x[SrTiO_3] \qquad (1)$$

$$(0.1 \le x \le 0.5)$$

$$(Bi_{1-x}Sr_x)(Fe_{1-x}Ti_x)O_3 \qquad (1')$$

$$(0.1 \le x \le 0.5)$$

In addition, it is preferable that the composite oxide which includes Bi, Fe, Sr, and Ti and has a perovskite structure includes at least one element selected from manganese (Mn), chromium (Cr), cobalt (Co), nickel (Ni), copper (Cu), and zinc (Zn) in addition to Bi, Fe, Sr, and Ti. By including at least one element selected from Mn, Cr, Co, Ni, Cu, and Zn, it is possible to enhance the leak characteristics and it is possible to realize the piezoelectric element excellent in piezoelectric characteristics by the lead-free based piezoelectric material and the liquid ejecting head provided with the piezoelectric element. Meanwhile, even in a case of the composite oxide including these elements, it is necessary to have a perovskite structure.

In a case where the piezoelectric layer 70 includes at least one element selected from Mn, Cr, Co, Ni, Cu, and Zn, Mn, Cr, Co, Ni, Cu, and Zn are positioned at the B site. For example, in a case where the piezoelectric layer 70 includes Mn, the composite oxide configuring the piezoelectric layer 70 is represented as a composite oxide having a structure in which a part of Fe or Ti of a solid solution in which bismuth ferrate and strontium titanate are uniformly solutionized is substituted with Mn or a composite oxide having a perovskite structure configured with the composition for achieving the mixed crystal of bismuth ferrate manganite and strontium titanate, and it is found that the leak characteristics are enhanced. In addition, also, in a case of including Cr, Co, Ni, Cu, and Zn, the leak characteristics are enhanced in the same way as in a case of including Mn. Meanwhile, in an X-ray diffraction pattern, for example, bismuth ferrate, strontium titanate, and bismuth ferrate manganite in which a part of Fe of bismuth ferrate is substituted with Mn or the like, bismuth ferrate chromate, bismuth ferrate cobaltate, bismuth ferrate nickelate, bismuth ferrate cuprate, bismuth ferrate zincate, and the like are not individually detected. In addition, also, in a case of simultaneously including two elements of other transition metal elements, it is found that the leak characteristics are enhanced in the same way, and these can be set to the piezoelectric layer 70.

In addition, the composite oxide which includes Bi, Fe, Sr and Ti and has a perovskite structure may be a composite oxide in which a part of Bi positioned at the A site is substituted with at least one element selected from lanthanum (La), cerium (Ce), praseodymium (Pr), neodymium (Nd), samarium (Sm), europium (Eu), dysprosium (Dy), thulium (Tm), and ytterbium (Yb), except Bi, Fe, Sr, and Ti. By substituting a part of Bi with at least one element selected from La, Ce, Pr, Nd, Sm, Eu, Dy, Tm, and Yb, a polarization treatment becomes easy and an adjustment of the Curie temperature becomes easy. Meanwhile, the composite oxide (the piezoelectric layer 70) explained above may further include other well-known additive agents in order to enhance the characteristics.

The second electrode 80 may be any of various types of metals such as iridium (Ir), platinum (Pt), tungsten (W), tantalum (Ta), or molybdenum (Mo), and, in addition, an alloy thereof and a metal oxide such as iridium oxide may be used. A lead electrode 90 including, for example, gold (Au) or the like, which is drawn from the vicinity of an end part of the ink supply passage 14 side and extended onto the elastic film 50 and also up to the insulation film which is arranged as necessary, is connected to each second electrode 80 which is the individual electrode of the piezoelectric element 300. The voltage is selectively applied to each piezoelectric element 300 through the lead electrode 90.

A protection substrate 30 having the manifold portion 31 configuring at least a part of a manifold 100 is joined onto the channel forming substrate 10 on which such the piezoelectric element 300 is formed, that is, onto the first electrode 60 and the elastic film 50, and the insulation film and the lead electrode 90 which are arranged as necessary, through an adhesive 35. In the embodiment, the manifold portion 31 penetrates the protection substrate 30 in a thickness direction, is formed over a width direction of the pressure generating chamber 12, and communicates with the communication portion 13 on the channel forming substrate 10 to configure the manifold 100 which becomes a common ink chamber of each pressure generating chamber 12, as described above. In addition, by plurally dividing the communication portion 13 of the channel forming substrate 10 for each pressure generating chamber 12, only the manifold portion 31 may be set to a manifold. Furthermore, for example, only the pressure generating chamber 12 may be arranged on the channel forming substrate 10 and the ink supply passage 14 in which the manifold 100 communicates with each pressure generating chamber 12 may be arranged on a member (for example, the elastic film 50, an insulation film which is arranged as necessary, or the like) interposed between the channel forming substrate 10 and the protection substrate 30.

In addition, a piezoelectric element holding portion 32 having a space of such a degree that does not inhibit the motion of the piezoelectric element 300 is arranged in a region facing to the piezoelectric element 300 of the protection substrate 30. The piezoelectric element holding portion 32 only needs to have a space of such a degree that does not inhibit the motion of the piezoelectric element 300, and the space may be sealed or may be not sealed.

As such the protection substrate 30, it is preferable to use a material having substantially the same coefficient of thermal expansion as that of the channel forming substrate 10, for example, a glass, a ceramic material, or the like, and, in the embodiment, the protection substrate 30 was formed by using the silicon single crystal substrate of the same material as the channel forming substrate 10.

In addition, a penetration hole 33 which penetrates the protection substrate 30 in a thickness direction is arranged on the protection substrate 30. Moreover, the vicinity of an end part of the lead electrode 90 which is drawn from each piezoelectric element 300 is arranged so as to be exposed in the penetration hole 33.

In addition, a driving circuit 120 for driving the piezoelectric element 300 arranged in parallel is fixed onto the protection substrate 30. As the driving circuit 120, for example, a circuit substrate, a semiconductor integrated circuit (IC), or the like can be used. Moreover, the driving circuit 120 and the lead electrode 90 are electrically connected through a wiring connection 121 formed of a conductive wire such as a bonding wire.

In addition, a compliance substrate 40 formed of a sealing film 41 and a fixing plate 42 is joined onto such the protection substrate 30. Here, the sealing film 41 includes a material in which rigidity is low and which has flexibility and one face of the manifold portion 31 is sealed by the sealing film 41. In addition, the fixing plate 42 is formed of a relatively hard material. Since a region facing to the manifold 100 of the fixing plate 42 becomes an opening portion 43 which is completely removed in a thickness direction, one face of the manifold 100 is sealed by only the sealing film 41 having flexibility.

In an ink jet type recording head I provided with such the piezoelectric element according to the embodiment, after the ink is taken from an ink outlet connected to an external ink supply section (not shown) and the inside from the manifold 100 up to the nozzle opening 21 is filled with the ink, the pressure in each pressure generating chamber 12 increases and ink droplets are discharged from the nozzle opening 21 by applying the voltage between each first electrode 60 and second electrode 80 in accordance with the pressure generating chamber 12 corresponding to a recording signal from the driving circuit 120 and flexurally deforming the elastic film 50, the adhesion layer 56, the first electrode 60, and the piezoelectric layer 70.

Next, an example of a method of manufacturing an ink jet type recording head in the embodiment will be described with reference to FIG. 4A to FIG. 8B. Meanwhile, FIG. 4A to FIG. 8B are cross-section views in a longitudinal direction of a pressure generating chamber.

Firstly, as shown in FIG. 4A, a silicon dioxide film including silicon dioxide ($SiO_2$) or the like which configures the elastic film 50 is formed on a surface of a wafer for a channel forming substrate 110 which is a silicon wafer by thermal oxidation or the like. Next, as shown in FIG. 4B, the adhesion layer 56 including titanium oxide or the like is formed on the elastic film 50 (silicon dioxide film) by a spattering method, thermal oxidation or the like.

Figure 5A:
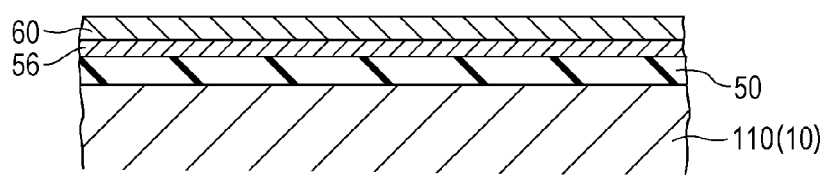
FIGS. 5A to 5C are cross-section views illustrating a manufacturing process of the recording head according to Embodiment 1.
Figure 5B:
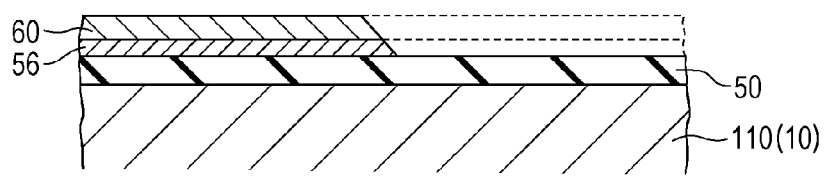

Next, as shown in FIG. 5A, the first electrode 60 including platinum is formed on the entire face of the adhesion layer 56 by a spattering method, a deposition method, or the like. Next, as shown in FIG. 5B, a resist in a predetermined shape (not shown) is set to a mask on the first electrode 60 and the adhesion layer 56 and the first electrode 60 are simultaneously patterned so that the side faces of the adhesion layer 56 and the first electrode 60 are inclined.

Next, after the resist is peeled off, the piezoelectric layer 70 which is a thin film is laminated on the first electrode 60. A method of forming the piezoelectric layer 70 is not particularly limited, however, for example, it is possible to form the piezoelectric layer 70 by using a chemical solution method such as a Metal-Organic Decomposition (MOD) method of obtaining the piezoelectric layer (the piezoelectric film) including a metal oxide by applying a solution including a metal complex, drying the film, and further calcining the film at a high temperature or a sol-gel method. Alternatively, it is possible to form the piezoelectric layer 70 also by a vapor phase method, a liquid phase method, or a solid phase method such as a laser ablation method, a spattering method, a pulse laser deposition method (a PLD method), a CVD method, or an aerosol deposition method.

Figure 5C:
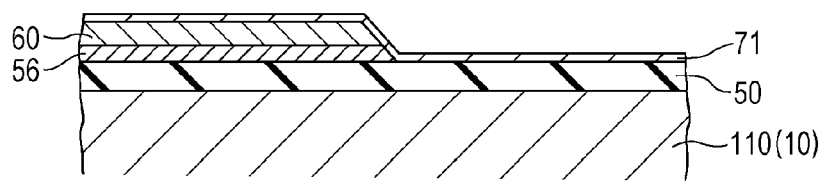

As a specific example of the formation procedure in a case of forming the piezoelectric layer 70 by a chemical solution method, firstly, as shown in FIG. 5C, a precursor film (a composite oxide layer precursor film) 71 of a composite oxide layer 72 (refer to FIGS. 6A and 6B) is formed by applying a composition for forming an oxide layer (a precursor solution) including an MOD solution or a sol including the metal complex, specifically, the metal complex including Bi, Fe, Sr, and Ti on the first electrode 60 using a spin coating method or the like (an applying process).

The precursor solution which is applied is a solution in which the metal complex which can form the composite oxide layer precursor film 71 including Bi, Fe, Sr, and Ti by calcineing, is mixed and the mixture is dissolved or dispersed in an organic solvent. In addition, in a case where the composite oxide layer precursor film 71 including Mn, Cr, Co, Ni, Cu, and Zn is formed, the precursor solution including the metal complex further having Mn, Cr, Co, Ni, Cu, and Zn, is used. As to the mixing proportion of the metal complex having the metal complex respectively including Bi, Fe, Sr, Ti, Mn, Cr, Co, Ni, Cu, and Zn, each metal may be mixed so as to become a desired molar ratio. As a metal complex respectively including Bi, Fe, Sr, Ti, Mn, Cr, Co, Ni, Cu, and Zn, for example, an alkoxide, an organic acid salt, a β-diketone complex, or the like can be used. As a metal complex including Bi, for example, bismuth 2-ethylhexanoate, bismuth acetate, and the like are included. As a metal complex including Fe, for example, iron 2-ethylhexanoate, iron acetate, tris(acetylacetonato) iron, and the like are included. As a metal complex including Sr, for example, strontium acetate, strontium ethoxide, strontium 2-ethylhexanoate, strontium acetylacetonate, and the like are included. As a metal complex including Ti, for example, titanium isopropoxide, titanium 2-ethylhexanoate, titanium(diisopropoxide)bis(acetylacetonate), and the like are included. As a metal complex including Mn, for example, manganese 2-ethylhexanoate, manganese acetate, and the like are included. As a metal complex including Cr, chromium 2-ethylhexanoate and the like are included. As a metal complex including Co, for example, cobalt 2-ethylhexanoate, cobalt (III) acetylacetonate, and the like are included. As a metal complex including Ni, for example, nickel 2-ethylhexanoate, nickel acetate, and the like are included. As a metal complex including Cu, for example, copper 2-ethylhexanoate, copper acetate, and the like are included. As a metal complex including Zn, for example, zinc 2-ethylhexanoate, zinc acetate, and the like are included. Naturally, the metal complex including two kinds or more of Bi, Fe, Sr, Ti, Mn, Cr, Co, Ni, Cu, and Zn may be used.

In addition, in a case where the composite oxide layer precursor film 71 including La, Ce, Pr, Nd, Sm, Eu, Dy, Tm, and Yb in addition to Bi, Fe, Sr, and Ti is formed, the precursor solution including the metal complex further having La, Ce, Pr, Nd, Sm, Eu, Dy, Tm, and Yb, is used. As to the mixing proportion of the metal complex having the metal complex respectively including La, Ce, Pr, Nd, Sm, Eu, Dy, Tm, and Yb, each metal may be mixed so as to become a desired molar ratio. As a metal complex respectively including La, Ce, Pr, Nd, Sm, Eu, Dy, Tm, and Yb, for example, an alkoxide, an organic acid salt, a β-diketone complex, or the like can be used. As a metal complex including La, for example, lantern 2-ethylhexanoate, and the like are included. As a metal complex including Ce, for example, cerium 2-ethylhexanoate, and the like are included. As a metal complex including Pr, for example, praseodymium 2-ethylhexanoate, and the like are included. As a metal complex including Nd, for example, neodymium 2-ethylhexanoate, and the like are included. As a metal complex including Sm, for example, samarium 2-ethylhexanoate, and the like are included. As a metal complex including Eu, for example, europium 2-ethylhexanoate, and the like are included. As a metal complex including Dy, for example, dysprosium 2-ethylhexanoate, and the like are included. As a metal complex including Tm, for example, thulium 2-ethylhexanoate, and the like are included. As a metal complex including Yb, for example, ytterbium 2-ethylhexanoate, and the like are included. Naturally, the metal complex including two kinds or more of La, Ce, Pr, Nd, Sm, Eu, Dy, Tm, and Yb, may be used.

In addition, as a solvent of the precursor solution, propanol, butanol, pentanol, hexanol, octanol, ethylene glycol, propylene glycol, octane, decane, cyclohexane, xylene, toluene, tetrahydrofuran, acetic acid, octyl acid, and the like are included.

Next, this composite oxide layer precursor film 71 is heated to a predetermined temperature (for example, from 150° C. to 200° C.) and then dried for a certain time (a drying process). Next, the dried composite oxide layer precursor film 71 is degreased by heating to a predetermined temperature (for example, from 350° C. to 450° C.) and retaining for a certain time (a degreasing process). The term degrease, mentioned here, means that an organic component included in the composite oxide layer precursor film 71 is separated as, for example, $NO_2$, $CO_2$, $H_2O$, or the like. An atmosphere in the drying process or the degreasing process is not limited and may be in the air, in an oxygen atmosphere, or in an inert gas. Meanwhile, the applying process, the drying process, and the degreasing process may be performed a plurality of times.

Next, as shown in FIG. 6A, the composite oxide layer precursor film 71 is calcined by heating to a predetermined temperature, for example, from approximately 600° C. to 850° C. and retaining for a certain time, for example, from 1 minute to 10 minutes (a calcineing process). Accordingly, the composite oxide layer precursor film 71 is crystallized to become the composite oxide layer 72 including the composite oxide which includes Bi, Fe, Sr, and Ti and has a perovskite structure. In the calcineing process, an atmosphere is also not limited and may be in the air, in an oxygen atmosphere, or in an inert gas. As a heating apparatus used in the drying process, the degreasing process, and the calcineing process, for example, a Rapid Thermal Annealing (RTA) apparatus for heating by irradiation with an infrared ray lamp, a hot plate, and the like are included.

Next, by repeating the applying process, the drying process, and the degreasing process or the applying process, the drying process, the degreasing process, and the calcineing process described above a plurality of times depending on a desired film thickness or the like and forming a plurality of layers of the composite oxide layer 72, the piezoelectric layer 70 which is formed of a plurality of layers of the composite oxide layer 72 and has a predetermined thickness is formed, as shown in FIG. 6B. For example, in a case where the film thickness of an application solution per time is approximately 0.1 µm, the entire film thickness of the piezoelectric layer 70 formed of 10 layers of the composite oxide layers 72 becomes approximately 1.0 µm. Meanwhile, in the embodiment, while 10 layers of the composite oxide layer 72 are laminated and arranged, the composite oxide layer 72 may be only one layer.

The piezoelectric layer 70 thus formed of the embodiment is configured with the composition for achieving the mixed crystal of the composite oxides in which the crystal structures are different, that is, the mixed crystal of bismuth ferrate which is a rhombohedral crystal and strontium titanate which is a cubical crystal, and has excellent ferroelectricity. Accordingly, it is possible to provide a piezoelectric element in which the displacement amount is enhanced.

Figure 7A:
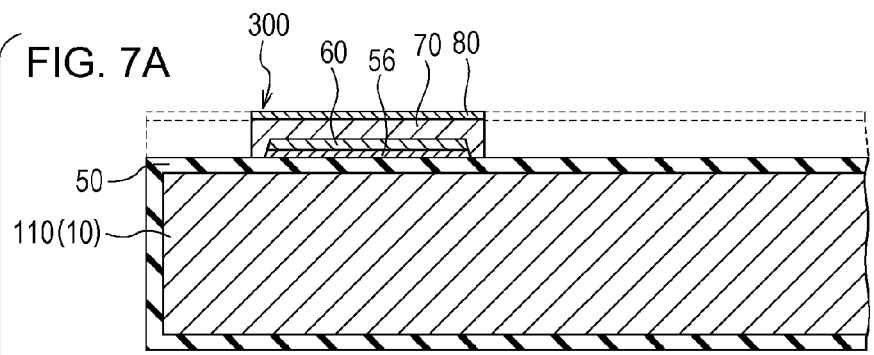
FIGS. 7A to 7C are cross-section views illustrating a manufacturing process of the recording head according to Embodiment 1.

After the piezoelectric layer 70 is formed, as shown in FIG. 7A, the second electrode 80 including platinum or the like is formed on the piezoelectric layer 70 by a sputtering method or the like, the piezoelectric layer 70 and the second electrode 80 are simultaneously patterned in a region facing to each pressure generating chamber 12, and the piezoelectric element 300 formed of the first electrode 60, the piezoelectric layer 70, and the second electrode 80, is formed. Meanwhile, the patterning of the piezoelectric layer 70 and the second electrode 80 can be collectively performed through the resist (not shown) which is formed in a predetermined shape by dry etching. Afterward, annealing may be performed in a temperature range, for example, from 600° C. to 850° C., as necessary. Accordingly, excellent interfaces between the piezoelectric layer 70 and the first electrode 60, and the piezoelectric layer 70 and the second electrode 80 can be formed and the crystallinity of the piezoelectric layer 70 can be improved.

Figure 7B:
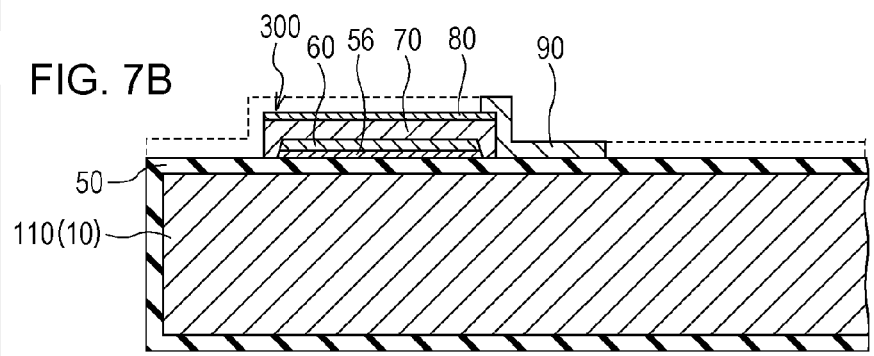

Next, as shown in FIG. 7B, after the lead electrode 90 including, for example, gold (Au) or the like is formed over the entire face of the wafer for a channel forming substrate 110, the patterning is performed for each piezoelectric element 300 through a mask pattern (not shown) formed of the resist or the like.

Figure 7C:
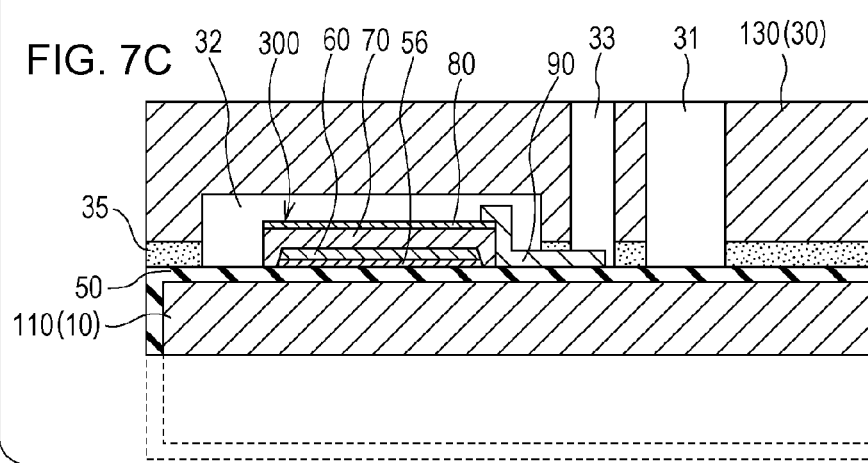

Next, as shown in FIG. 7C, after a wafer for a protection substrate 130 which is a silicon wafer and becomes a plurality of protection substrates 30 is joined to the piezoelectric element 300 side of the wafer for a channel forming substrate 110 through the adhesive 35, the wafer for a channel forming substrate 110 is thinned down to a predetermined thickness.

Figure 8A:
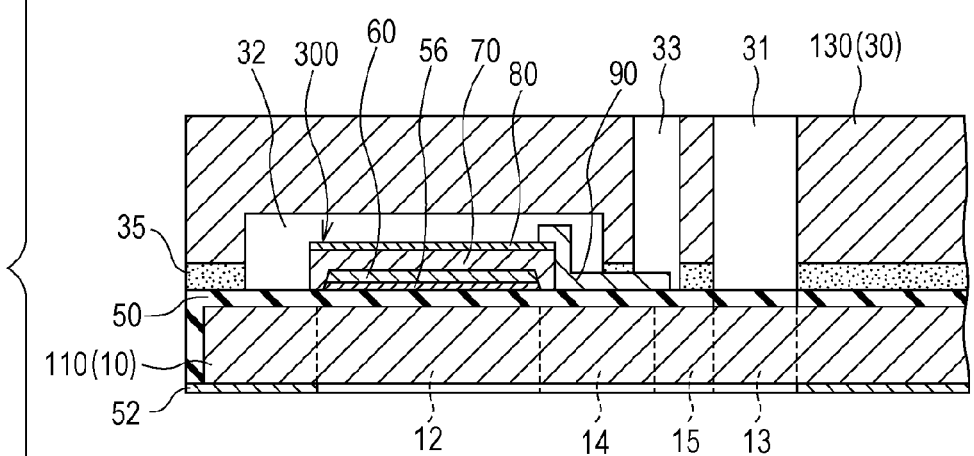
FIGS. 8A to 8B are cross-section views illustrating a manufacturing process of the recording head according to Embodiment 1.

Next, as shown in FIG. 8A, a mask film 52 is newly formed on the wafer for a channel forming substrate 110 and patterned into a predetermined shape.

Figure 8B:
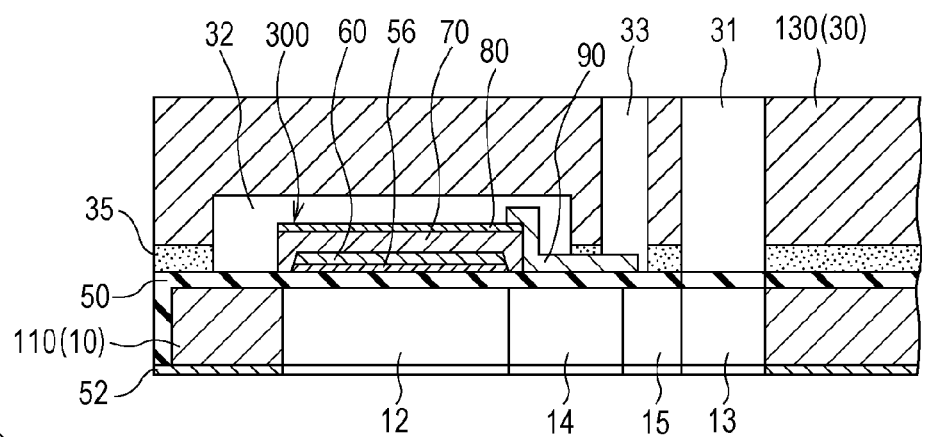

Moreover, as shown in FIG. 8B, by subjecting the wafer for a channel forming substrate 110 to anisotropic etching (wet etching) using an alkaline solution such as KOH or the like through the mask film 52, the pressure generating chamber 12, the communication portion 13, the ink supply passage 14, the communication passage 15, and the like in accordance with the piezoelectric element 300 are formed.

Afterward, an unnecessary part of an outer peripheral edge part of the wafer for a channel forming substrate 110 and the wafer for a protection substrate 130 is removed by cutting by, for example, dicing or the like. Moreover, after the mask film 52 of the wafer for a channel forming substrate 110 on the face of the side opposite to the wafer for a protection substrate 130, is removed, the ink jet type recording head I of the embodiment is prepared by joining the nozzle plate 20 in which the nozzle opening 21 is bored, also joining the compliance substrate 40 to the wafer for a protection substrate 130, and dividing the wafer for a channel forming substrate 110 or the like into one chip size of the channel forming substrate 10 or the like as shown in FIG. 1.

EXAMPLE

Hereinafter, more specifically, the invention will be described by showing Examples. Meanwhile, the invention is not limited to the following Examples.

Example 1

Firstly, a silicon dioxide film having a film thickness of 1,170 nm was formed on a surface of a single crystal silicon (Si) substrate which was oriented to (110) by thermal oxidation. Next, a titanium oxide film (the adhesion layer 56) was formed by forming a titanium film having a film thickness of 40 nm on the silicon dioxide film by an RF magnetron sputtering method and subjecting the titanium film to thermal oxidation. Next, a platinum film (the first electrode 60) having a film thickness of 100 nm was formed on the titanium oxide film by an RF magnetron sputtering method.

Next, the piezoelectric layer 70 was formed on the first electrode 60 by a spin coating method. The technique is as follow. Firstly, an n-octane solution of bismuth 2-ethylhexanoate, iron 2-ethylhexanoate, manganese 2-ethylhexanoate, strontium 2-ethylhexanoate, and titanium 2-ethylhexanoate were mixed so that the molar ratio of Bi, Fe, Mn, Sr, and Ti became Bi:Fe:Mn:Sr:Ti=90.0:85.5:4.5:10.0:10.0, and the precursor solution was prepared.

Next, after the prepared precursor solution was dropped onto the substrate described above on which the first electrode 60 was formed and the substrate was rotated at 500 rpm for 5 seconds, the substrate was rotated at 3,000 rpm for 20 seconds and the composite oxide layer precursor film 71 was formed by a spin coating method (an applying process). Then, the substrate described above was put on a hot plate and dried at 180° C. for 2 minutes (a drying process). Next, the substrate described above was put on a hot plate and degreased at 350° C. for 2 minutes (a degreasing process). After from the solution application to the degreasing process were repeated twice, calcineing was performed in an oxygen atmosphere for 5 minutes at 750° C. using an RTA apparatus (a calcineing process). Next, the piezoelectric layer 70 formed of total 12 layers of the composite oxide layers 72 was formed by repeating the processes 6 times described above and total 12 times of applications.

Afterward, an iridium film (the second electrode 80) having a film thickness of 50 nm was formed on the piezoelectric layer 70 by an RF magnetron spattering method. Accordingly, the piezoelectric element 300 provided with the piezoelectric layer 70 in which the content of strontium titanate was 10.0 mol % with respect to the piezoelectric layer and which was configured with the composition for achieving the mixed crystal of bismuth ferrate and strontium titanate, was obtained.

Example 2

The same operation as that of Example 1 was performed except mixing an n-octane solution of bismuth 2-ethylhexanoate, iron 2-ethylhexanoate, manganese 2-ethylhexanoate, strontium 2-ethylhexanoate, and titanium 2-ethylhexanoate so that the molar ratio of Bi, Fe, Mn, Sr, and Ti became Bi:Fe:Mn:Sr:Ti=80.0:76.0:4.0:20.0:20.0 as a precursor solution and using the precursor solution. Accordingly, the piezoelectric element 300 provided with the piezoelectric layer 70 in which the content of strontium titanate was 20.0 mol % with respect to the piezoelectric layer and which was configured with the composition for achieving the mixed crystal of bismuth ferrate and strontium titanate, was obtained.

Example 3

The same operation as that of Example 1 was performed except mixing an n-octane solution of bismuth 2-ethylhexanoate, iron 2-ethylhexanoate, manganese 2-ethylhexanoate, strontium 2-ethylhexanoate, and titanium 2-ethylhexanoate so that the molar ratio of Bi, Fe, Mn, Sr, and Ti became Bi:Fe:Mn:Sr:Ti=75.0:71.25:3.75:25.0:25.0 as a precursor solution and using the precursor solution. Accordingly, the piezoelectric element 300 provided with the piezoelectric layer 70 in which the content of strontium titanate was 25.0 mol % with respect to the piezoelectric layer and which was configured with the composition for achieving the mixed crystal of bismuth ferrate and strontium titanate, was obtained.

Example 4

The same operation as that of Example 1 was performed except mixing an n-octane solution of bismuth 2-ethylhexanoate, iron 2-ethylhexanoate, manganese 2-ethylhexanoate, strontium 2-ethylhexanoate, and titanium 2-ethylhexanoate so that the molar ratio of Bi, Fe, Mn, Sr, and Ti became Bi:Fe:Mn:Sr:Ti=70.0:66.5:3.5:30.0:30.0 as a precursor solution and using the precursor solution. Accordingly, the piezoelectric element 300 provided with the piezoelectric layer 70 in which the content of strontium titanate was 30.0 mol % with respect to the piezoelectric layer and which was configured with the composition for achieving the mixed crystal of bismuth ferrate and strontium titanate, was obtained.

Example 5

The same operation as that of Example 1 was performed except mixing an n-octane solution of bismuth 2-ethylhexanoate, iron 2-ethylhexanoate, manganese 2-ethylhexanoate, strontium 2-ethylhexanoate, and titanium 2-ethylhexanoate so that the molar ratio of Bi, Fe, Mn, Sr, and Ti became Bi:Fe:Mn:Sr:Ti=65.0:61.75:3.25:35.0:35.0 as a precursor solution and using the precursor solution. Accordingly, the piezoelectric element 300 provided with the piezoelectric layer 70 in which the content of strontium titanate was 35.0 mol % with respect to the piezoelectric layer and which was configured with the composition for achieving the mixed crystal of bismuth ferrate and strontium titanate, was obtained.

Example 6

The same operation as that of Example 1 was performed except mixing an n-octane solution of bismuth 2-ethylhexanoate, iron 2-ethylhexanoate, manganese 2-ethylhexanoate, strontium 2-ethylhexanoate, and titanium 2-ethylhexanoate so that the molar ratio of Bi, Fe, Mn, Sr, and Ti became Bi:Fe:Mn:Sr:Ti=60.0:57.0:3.0:40.0:40.0 as a precursor solution and using the precursor solution. Accordingly, the piezoelectric element 300 provided with the piezoelectric layer 70 in which the content of strontium titanate was 40.0 mol % with respect to the piezoelectric layer and which was configured with the composition for achieving the mixed crystal of bismuth ferrate and strontium titanate, was obtained.

Example 7

The same operation as that of Example 1 was performed except mixing an n-octane solution of bismuth 2-ethylhexanoate, iron 2-ethylhexanoate, manganese 2-ethylhexanoate, strontium 2-ethylhexanoate, and titanium 2-ethylhexanoate so that the molar ratio of Bi, Fe, Mn, Sr, and Ti became Bi:Fe:Mn:Sr:Ti=55.0:52.25:2.75:45.0:45.0 as a precursor solution and using the precursor solution. Accordingly, the piezoelectric element 300 provided with the piezoelectric layer 70 in which the content of strontium titanate was 45.0 mol % with respect to the piezoelectric layer and which was configured with the composition for achieving the mixed crystal of bismuth ferrate and strontium titanate, was obtained.

Example 8

The same operation as that of Example 1 was performed except mixing an n-octane solution of bismuth 2-ethylhexanoate, iron 2-ethylhexanoate, manganese 2-ethylhexanoate, strontium 2-ethylhexanoate, and titanium 2-ethylhexanoate so that the molar ratio of Bi, Fe, Mn, Sr, and Ti became Bi:Fe:Mn:Sr:Ti=50.0:47.5:2.5:50.0:50.0 as a precursor solution and using the precursor solution. Accordingly, the piezoelectric element 300 provided with the piezoelectric layer 70 in which the content of strontium titanate was 50.0 mol % with respect to the piezoelectric layer and which was configured with the composition for achieving the mixed crystal of bismuth ferrate and strontium titanate, was obtained.

Example 9

The same operation as that of Example 1 was performed except mixing an n-octane solution of bismuth 2-ethylhexanoate, iron 2-ethylhexanoate, manganese 2-ethylhexanoate, strontium 2-ethylhexanoate, and titanium 2-ethylhexanoate so that the molar ratio of Bi, Fe, Mn, Sr, and Ti became Bi:Fe:Mn:Sr:Ti=71.5:61.75:3.25:35.0:35.0 as a precursor solution and using the precursor solution. Accordingly, the piezoelectric element 300 provided with the piezoelectric layer 70 in which the content of strontium titanate was 35.0 mol % with respect to the piezoelectric layer and which was configured with the composition for achieving the mixed crystal of bismuth ferrate and strontium titanate, in which Bi was included while exceeding a stoichiometry composition by 10 mol %, was obtained.

Example 10

The same operation as that of Example 1 was performed except mixing an n-octane solution of bismuth 2-ethylhexanoate, iron 2-ethylhexanoate, manganese 2-ethylhexanoate, strontium 2-ethylhexanoate, and titanium 2-ethylhexanoate so that the molar ratio of Bi, Fe, Mn, Sr, and Ti became Bi:Fe:Mn:Sr:Ti=66.0:57.0:3.0:40.0:40.0 as a precursor solution and using the precursor solution. Accordingly, the piezoelectric element 300 provided with the piezoelectric layer 70 in which the content of strontium titanate was 40.0 mol % with respect to the piezoelectric layer and which was configured with the composition for achieving the mixed crystal of bismuth ferrate and strontium titanate, in which Bi was included while exceeding a stoichiometry composition by 10 mol %, was obtained.

Comparative Example 1

The same operation as that of Example 1 was performed except mixing an n-octane solution of bismuth 2-ethylhexanoate and iron 2-ethylhexanoate so that the molar ratio of Bi and Fe became Bi:Fe=100:100 as a precursor solution and using the precursor solution. Accordingly, the piezoelectric element 300 provided with the piezoelectric layer 70 including bismuth ferrate of a solitary crystal, was obtained.

Comparative Example 2

The same operation as that of Example 1 was performed except mixing an n-octane solution of bismuth 2-ethylhexanoate, iron 2-ethylhexanoate, and manganese 2-ethylhexanoate so that the molar ratio of Bi, Fe, and Mn became Bi:Fe:Mn=100:95:5 as a precursor solution and using the precursor solution. Accordingly, the piezoelectric element 300 provided with the piezoelectric layer 70 including bismuth ferrate manganite of a solitary crystal, was obtained.

Reference Example 1

The same operation as that of Example 1 was performed except mixing an n-octane solution of bismuth 2-ethylhexanoate, lantern 2-ethylhexanoate, iron 2-ethylhexanoate, and manganese 2-ethylhexanoate so that the molar ratio of Bi, La, Fe, and Mn became Bi:La:Fe:Mn=80:20:97:3 as a precursor solution and using the precursor solution. Accordingly, the piezoelectric element 300 provided with the piezoelectric layer 70 including bismuth lantern ferrate manganite of a solitary crystal, was obtained.

Test Example 1

For each piezoelectric element of Examples 1 to 10, Comparative Examples 1 and 2, and Reference Example 1, a relationship between the displacement amount and the voltage (a butterfly curve) was obtained by using a displacement measuring apparatus (DBLI) manufactured by aixACCT Systems GmbH at room temperature, using an electrode pattern of $\phi$=500 μm, and applying the voltage having a frequency of 1 kHz. Moreover, according to these butterfly curves, the maximum strain amounts of the piezoelectric elements from a reaching strain to a reverse reaching strain were respectively obtained. The results obtained by measuring the maximum strain amounts are shown in FIG. 9 and Table 1. Moreover, as to the piezoelectric elements of Comparative Examples 1 and 2, since the leak current was large, the maximum strain amount could not be measured.

As shown in FIG. 9, as to the piezoelectric elements of Examples 2 to 7, 9, and 10 in which the piezoelectric layer was configured with the composition for achieving the mixed crystal of bismuth ferrate manganite which was a rhombohedral crystal and strontium titanate which was a cubical crystal and the content of the strontium titanate was from 20 mol % to 45 mol % with respect to the piezoelectric layer, all maximum strain amounts became large, compared with Reference Example 1 in which the piezoelectric layer included bismuth lantern ferrate manganite of a solitary crystal. Among those, as to Examples 3 to 6 in which the content of the strontium titanate was from 25 mol % to 40 mol % with respect to the piezoelectric layer, the maximum strain amounts were large and, in particular, the maximum strain amounts of Examples 4 and 5 in which the contents of strontium titanate were 30 mol % and 35 mol %, became as large as 2.09 nm and 2.11 nm. Furthermore, as to Examples 9 and 10 in which Bi was included while exceeding a stoichiometry composition by 10 mol % with respect to Examples 5 and 6, the maximum strain amounts became, in the extreme, as large as 2.69 nm and 2.31 nm. Accordingly, it was found that it was possible to enhance the displacement amount by configuring the piezoelectric layer with the composition for achieving the mixed crystal of bismuth ferrate manganite which was a rhombohedral crystal and strontium titanate which was a cubical crystal and setting the content of the strontium titanate to be from 20 mol % to 45 mol % with respect to the piezoelectric layer, and it was possible to remarkably enhance the displacement amount by including Bi to exceed a stoichiometry composition by 10 mol %.

Figure 11:
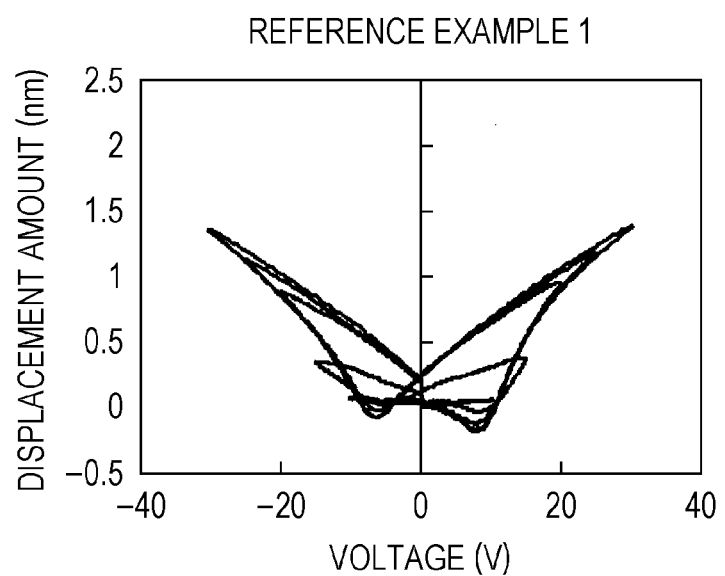
FIG. 11 is a view illustrating a relationship between a displacement amount and a voltage of Reference Example 1.

In addition, in FIG. 10A and FIG. 10B, the butterfly curves of Examples 5 and 9 are shown and, in FIG. 11, the butterfly curve of Reference Example 1 is shown. As to the butterfly curves of Examples 5 and 9, while a decrease in displacement amount accompanying an increase in applied voltage was very moderate, in Reference Example 1, the displacement amount largely decreased as the applied voltage increased. It was also found that according to the shapes of such butterfly curves, the displacement characteristics (electric field induced strain characteristics) of Examples 5 and 9 were more excellent, compared with Reference Example 1.

Here, in a case where hysteresis curves are measured for each piezoelectric element of Examples 1 to 10, Comparative Examples 1 and 2, and Reference Example 1, it has been found that as to the hysteresis curves of Examples 1 to 10, squareness is excellent and a residual polarization value ($P_r$) is high, and thus the piezoelectric element becomes a ferroelectrics having sufficient insulation. Such a ferroelectrics can be effectively used, for example, as a nonvolatile memory, or the like. Therefore, not only the piezoelectric elements of Examples 2 to 7, 9, and 10 in which the maximum strain amounts are large, but also the piezoelectric elements of Example 1 in which the maximum strain amount is equal to that of Reference Example 1 and Example 8 in which the maximum strain amount is slightly smaller than that of Reference Example 1 are sufficiently practically usable for an application utilizing ferroelectricity.

TABLE 1

| | Content of Sr with respect to piezoelectric layer | Maximum strain amount (nm) |
| --- | --- | --- |
| Example 1 | 10 mol % | 1.45 |
| Example 2 | 20 mol % | 1.72 |
| Example 3 | 25 mol % | 1.91 |
| Example 4 | 30 mol % | 2.09 |
| Example 5 | 35 mol % | 2.11 |
| Example 6 | 40 mol % | 1.95 |
| Example 7 | 45 mol % | 1.60 |
| Example 8 | 50 mol % | 1.27 |
| Example 9 | 35 mol % (Bi is included excessively by 10 mol %) | 2.69 |
| Example 10 | 40 mol % (Bi is included excessively by 10 mol %) | 2.31 |
| Comparative Example 1 | 0 mol % | Unmeasurable since leak current is large |
| Comarative Example 2 | 0 mol % | Unmeasurable since leak current is large |
| Reference Example 1 | 0 mol % | 1.45 |

Other Embodiments

Hereinbefore, one embodiment of the liquid ejecting head of the invention was described, however, a basic configuration of the invention is not limited to the embodiment described above. For example, while, in the embodiment described above, the silicon single crystal substrate was exemplified as the channel forming substrate 10, the channel forming substrate 10 is not particularly limited thereto and, for example, a material such an SOI substrate or a glass may be used.

Furthermore, in the embodiment described above, while the piezoelectric element 300 in which the first electrode 60, the piezoelectric layer 70, and the second electrode 80 were sequentially laminated on the substrate (the channel forming substrate 10) was exemplified, the piezoelectric element 300 is not particularly limited thereto and, for example, the invention can also be applied to a vertical vibration type piezoelectric element in which the piezoelectric material and an electrode forming material are alternately laminated to be expanded and contracted in an axis direction.

Figure 12:
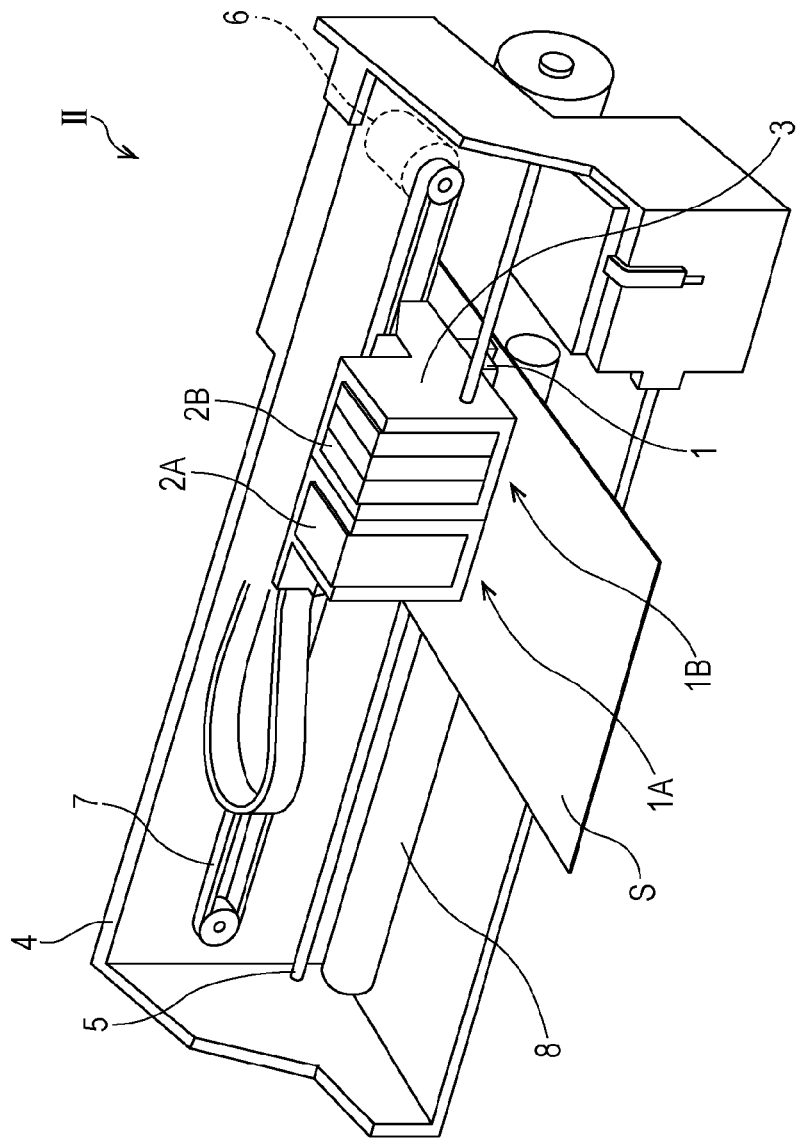
FIG. 12 is a view illustrating a schematic configuration of a recording apparatus according to an embodiment of the invention.

In addition, the ink jet type recording head I (refer to FIG. 1) is mounted on, for example, an ink jet type recording apparatus II, as shown in FIG. 12. Cartridges 2A and 2B configuring the ink supply section are detachably arranged on recording head units 1A and 1B having the ink jet type recording head I and a carriage 3 having the recording head units 1A and 1B mounted thereon is arranged to be movable in an axis direction, along a carriage shaft 5 attached to an apparatus main body 4. The recording head units 1A and 1B ejects, for example, a black ink composition and a color ink composition.

Moreover, by transmitting a driving force of a driving motor 6 to the carriage 3 through a plurality of gears (not shown) and a timing belt 7, the carriage 3 having the recording head units 1A and 1B mounted thereon is moved along the carriage shaft 5. On the other hand, a transport roller 8 is arranged as a transport section in the apparatus main body 4 and a recording sheet S which is a recording medium such as paper is transported by the transport roller 8. Meanwhile, the transport section for transporting the recording sheet S is not limited to the transport roller and may be a belt, a drum, or the like.

Meanwhile, in the example describe above, the ink jet type recording apparatus in which the ink jet type recording head I is mounted on the carriage 3 and which is moved in a main scanning direction was exemplified as the ink jet type recording apparatus II, however, the configuration thereof is not particularly limited. The ink jet type recording apparatus II may be, for example, a so-called line type recording apparatus in which printing is performed by fixing the ink jet type recording head I and moving the recording sheet S such as paper in a sub scanning direction.

In addition, in the embodiment described above, while description was given by giving the ink jet type recording head as an example of the liquid ejecting head provided with the piezoelectric element, the invention is widely targeted at the liquid ejecting head in general and can be also naturally applied to the liquid ejecting head which ejects a liquid except an ink. As other liquid ejecting heads, for example, various kinds of recording heads used for an image recording apparatus such as a printer, a color material ejecting head used for manufacturing a color filter such as a liquid crystal display, an electrode material ejecting head used for forming an electrode of an organic EL display, a field emission display (FED), or the like, a living body organic matter ejecting head used for manufacturing a biochip, and the like are included.

In addition, the piezoelectric element 300 according to the invention can be used by being mounted on various kinds of sensors. As various kinds of sensors, for example, a pyroelectric sensor, an infrared ray sensor, a terahertz sensor, a temperature sensor, an ultrasonic sensor, a thermosensitive sensor, a pressure sensor, an acceleration sensor, a gyro sensor (an angular velocity sensor), and the like are included. Since these sensors are provided with the piezoelectric layer 70 which has excellent ferroelectricity and in which the displacement amount is enhanced, the detection sensitivity becomes high.

In addition, since the piezoelectric layer 70 has excellent ferroelectricity, the piezoelectric element 300 according to the invention can be suitably used for a ferroelectrics element. As a ferroelectrics element, a ferroelectrics memory (FeRAM), a ferroelectrics transistor (FeFET), a ferroelectrics operation circuit (FeLogic), a ferroelectrics capacitor, and the like are included.

Furthermore, the piezoelectric element 300 according to the invention can be suitably used for an optical element. As an optical element, a wavelength conversion device, an optical waveguide, a blocking filter of a harmful light ray such as an infrared ray, an optical filter using a photonic crystal effect by forming a quantum dot, an optical filter using the optical interference of a thin film, an optical-thermal conversion filter using a specific pattern structure, and the like are included.

Furthermore, the piezoelectric element 300 according to the invention can be used by being mounted on a power generation apparatus. As a power generation apparatus, a power generation apparatus using a pressure-electric conversion effect, a power generation apparatus using electron excitation by light (photoelectromotive force), a power generation apparatus using electron excitation by heat (thermal electromotive force), a power generation apparatus using vibration, and the like are included.

In addition, the piezoelectric element 300 according to the invention is not limited to the piezoelectric element which is used for the liquid ejecting head described above, the liquid ejecting apparatus provided with the liquid ejecting head, various kinds of sensors, the ferroelectric element, the optical element, and the power generation apparatus and can be also used for other devices. As other devices, for example, an ultrasonic device such as an ultrasonic transmitter, an ultrasonic motor, a piezoelectric transformer, a piezoelectric motor, a vibration type dust removing apparatus, and the like are included.

The entire disclosure of Japanese Patent Application No. 2014-008030, filed Jan. 20, 2014 is expressly incorporated by reference herein.

The invention claimed is:

1. A piezoelectric element comprising:
    a first electrode;
    a piezoelectric layer arranged on the first electrode; and
    a second electrode arranged on the piezoelectric layer,
    wherein the piezoelectric layer includes a composite oxide which has a perovskite structure, and
    wherein the composite oxide has a composition represented as a mixed crystal of bismuth ferrate and strontium titanate.

2. The piezoelectric element according to claim 1,
    wherein bismuth and strontium of the composite oxide are included at an A site of the perovskite structure, and
    wherein iron and titanium of the composite oxide are included at a B site of the perovskite structure.

3. The piezoelectric element according to claim 1,
    wherein a content of strontium titanate of the composite oxide is from 10 mol % to 50 mol % with respect to the composite oxide.

4. The piezoelectric element according to claim 1,
    wherein the composite oxide includes at least one element selected from manganese, chromium, cobalt, nickel, copper, and zinc.

5. The piezoelectric element according to claim 1,
wherein, in the composite oxide, the bismuth is included while exceeding a stoichiometry composition by more than 0 mol % and 10 mol % or less.

6. The piezoelectric element according to claim 1,
wherein the composite oxide is represented by the following general formula (1) or (1'), $$(1-x)[BiFeO_3]\text{-}x[SrTiO_3] \tag{1}$$

$(0.1 \leq x \leq 0.5)$ $$(Bi_{1-x}Sr_x)(Fe_{1-x}Ti_x)O_3 \tag{1'}$$

$(0.1 \leq x \leq 0.5)$.

7. A liquid ejecting head comprising:
the piezoelectric element according to claim 1.

8. A sensor comprising:
the piezoelectric element according to claim 1.

9. A piezoelectric device comprising:
the piezoelectric element according to claim 1.

* * * * *